(12) United States Patent
Mikhemar et al.

(10) Patent No.: US 8,872,593 B2
(45) Date of Patent: Oct. 28, 2014

(54) ON-CHIP R AND C CALIBRATION USING ON-BOARD SUPPLY BYPASS CAPACITANCE

(71) Applicant: Broadcom Corporation, Irvine, CA (US)

(72) Inventors: Mohyee Mikhemar, Aliso Viejo, CA (US); Hooman Darabi, Laguna Niguel, CA (US)

(73) Assignee: Broadcom Corporation, Irvine, CA (US)

( * ) Notice: Subject to any disclaimer, the term of this patent is extended or adjusted under 35 U.S.C. 154(b) by 108 days.

(21) Appl. No.: 13/734,805

(22) Filed: Jan. 4, 2013

(65) Prior Publication Data

US 2014/0191782 A1 Jul. 10, 2014

(51) Int. Cl.
| | |
|---|---|
| *G01R 23/00* | (2006.01) |
| *H03B 21/00* | (2006.01) |
| *G01L 9/12* | (2006.01) |
| *G01R 27/26* | (2006.01) |
| *G01R 31/01* | (2006.01) |
| *H03K 3/354* | (2006.01) |

(52) U.S. Cl.
CPC ............ *H03B 21/00* (2013.01); *G01R 27/2605* (2013.01); *G01L 9/12* (2013.01); *G01R 31/016* (2013.01); *H03K 3/354* (2013.01)
USPC ............. 331/44; 324/601; 324/679; 331/111; 331/140; 331/143; 331/177 R

(58) Field of Classification Search
CPC ..... G01R 27/2605; G01R 31/016; G01L 9/12; H03K 3/354; H03B 21/00
USPC ............ 324/601, 679; 331/44, 111, 140, 143, 331/177 R
See application file for complete search history.

(56) References Cited

U.S. PATENT DOCUMENTS

| | | | |
|---|---|---|---|
| 5,594,388 A | * | 1/1997 | O'Shaughnessy et al. ... 331/1 R |
| 7,382,153 B2 | | 6/2008 | Ou-yang et al. |
| 2012/0112773 A1 | | 5/2012 | Zolfaghari et al. |

OTHER PUBLICATIONS

Putter, "On-chip RC measurement and calibration circuit using Wheatstone bridge," 2008 IEEE pp. 1496-1499.

* cited by examiner

*Primary Examiner* — Arnold Kinkead
*Assistant Examiner* — Richard Tan
(74) *Attorney, Agent, or Firm* — McDermott Will & Emery LLP

(57) ABSTRACT

A technique for calibration of on-chip resistance (R) and capacitance (C) values using an on-board bypass capacitor may include configuring an on-chip switch to selectively couple an on-chip calibration circuit to an on-chip port. The on-chip calibration circuit may include an RC oscillator having an RC time constant (RCTC). The on-board bypass capacitor may be coupled to the on-chip calibration circuit, by using the on-chip port. The on-chip R and C values may be calibrated using the on-chip calibration circuit and the on-board bypass capacitor.

20 Claims, 3 Drawing Sheets

ON-CHIP R AND C CALIBRATION USING ON-BOARD SUPPLY BYPASS CAPACITANCE

TECHNICAL FIELD

The present description relates generally to radio frequency (RF) communications, and more particularly, but not exclusively, to on-chip resistance (R) and capacitance (C) calibration using on-board supply bypass capacitance.

BACKGROUND

Many integrated circuits include circuitry that may use resistors and capacitors as parts of their passive elements used to perform their associated functionalities. For example, various basic analog circuits such as amplifiers, filters, oscillators, and power supplies, and many of the more complex circuitries such as receivers, transmitters, analog-to-digital convertors, etc. may include capacitor and resistor elements. On-chip resistor elements may be implemented, for example, in bipolar technology, by resistor structures such as based-diffused, emitter-diffused, ion implanted, and epitaxial resistors or by thin-film poly-silicon resistors (poly-resistors). The resistance value of an on-chip resistor may be expressed in terms of dimensions such as length (L), width (W), and the sheet resistivity ($R_{sq}$). The sheet resistivity may depend on a number of parameters such as the material of the structure and the process used, and may vary with temperature and from process-run to process-run and even from wafer to wafer.

On-chip capacitor structures may include MOS and junction capacitors. For example, in bipolar technology, an on-chip capacitor may be implemented by forming a metal layer (e.g., aluminum) on a thin oxide layer (e.g., SiO2 layer) grown, for instance, on an emitter diffusion. On-chip resistor and capacitor values may be calibrated using on-chip calibration circuits and off-chip reference elements such as accurate resistors and capacitors. The use of the off-chip elements specifically for calibration purposes may use one or more pins of the chip as dedicated for connecting the off-chip elements.

BRIEF DESCRIPTION OF THE DRAWINGS

Certain features of the subject technology are set forth in the appended claims. However, for purpose of explanation, several embodiments of the subject technology are set forth in the following figures.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and may be practiced using one or more implementations. In one or more instances, well-known structures and components are shown in block diagram form in order to avoid obscuring the concepts of the subject technology.

Figure 1A:
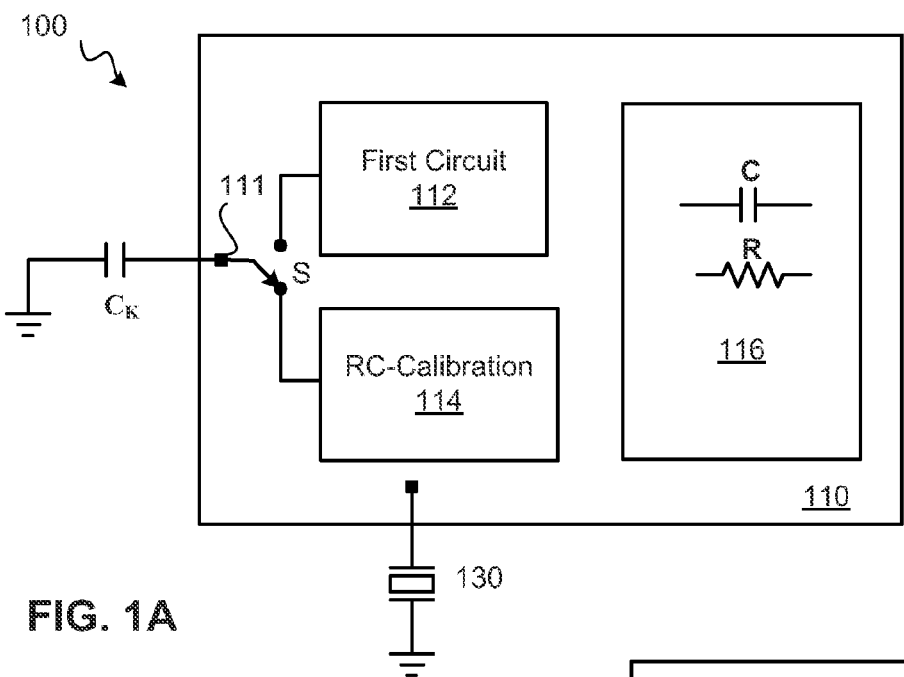
FIG. 1A illustrates an example device for on-chip resistance (R) and capacitance (C) calibration in accordance with one or more implementations.

FIG. 1A illustrates an example device 100 for on-chip R and C calibration in accordance with one or more implementations of the subject technology. The device 100 may include a chip 110 (e.g., a chip of a semiconductor die such as a silicon die), a supply bypass capacitor $C_k$, and a crystal oscillator 130 (e.g., a reference oscillator), both of which may be already available. The supply bypass capacitor $C_k$, for example, may be used to bypass a supply voltage in a first circuit 112 of the chip 110, and the crystal oscillator 130 may be used as a reference oscillator for an on-chip frequency synthesizer of a portion 116 of the chip 110. In one or more implementations, the portion 116 may include an RF transceiver (e.g., a cell phone transceiver). The cell phone transceiver should be capable of transmitting and receiving precise channels within an available frequency band. In order to select specific channels, the cell phone transceiver has to be able to precisely tune its transceiver so as to minimize cross talk with other transmissions. Various filter circuits used in cell phone transceivers may use on-chip capacitors and resistors, for which precise calibration of their values may be critical to a desired performance of the cell phone transceiver.

It is possible to leverage the inexpensive poly-silicon process to create poly-resistors in various semiconductor devices (i.e., on-chip resistors and capacitors). On-chip capacitors may include metal-insulator-metal (MIS) capacitors, such as metal-oxide-metal (MOM) capacitors. Due to manufacturing variations, the actual resistance (R) or capacitance (C) of such resistors and capacitors may not be the same as a desired resistance or capacitance, and the value of the on-chip resistance (R) and capacitance (C) may vary from chip to chip with the process variations. For example, an on-chip resistor designed with a value of 2 kΩ may have a nominal value of 2 kΩ with a variation of approximately ±300Ω. Similarly a capacitor with a nominal value of 1 pF may change to 1 pF±150 fF. Some circuitries, for example, analog filters and amplifiers may need accurate values of resistors and capacitors. To compensate for process variations and to meet the stringent accuracy requirements an on-chip calibration may be used to measure the value of a resistance and a capacitance of an on-chip calibration circuit and use the result to adjust the value of the resistances and capacitances used in amplifiers and filters.

A manufactured on-chip resistor or capacitor may, for example, have known dimensions (e.g., width (W) and length (L)), and thus their resistance and capacitance may be a known factor (e.g., M and N) of an on-chip unit-resistance ($R_u$) or unit-capacitance (CO, respectively. In one or more implementations, it is possible to choose a 1 pF unit-capacitance (e.g., $C_{u1p}$) and implement it as a binary weighted array of a smaller unit-capacitor with $C_{LSB}$=20 fF. The value of the 1 pF unit-capacitance may therefore be given as: $C_{u1p}$=N $C_{LSB}$. In a nominal chip, $C_{LSB}$=20 fF so N=50 sets the $C_{u1p}$ to 1 pF, that is the nominal value of 1 pF unit-capacitance. In a different chip with a lower capacitance density $C_{LSB}$=18 fF, the calibration will yield N=56. Similarly, for the on-chip resistor, $R_{u20k}$=$MR_{LSB}$, the value of M (e.g., a multiplier factor) for the nominal case may be 20 (e.g., for $R_{LSB}$=1KΩ and may change from chip to chip so that $R_{u20k}$ remains a constant 20 kg).

All on-chip amplifiers and filters that may work with accurate values of R and C, may use the unit resistance (e.g., Ru, such as $R_{u20k}$) and unit capacitance (e.g., $C_u$, such as $C_{LSB}$) to build any value of resistance and capacitance using a mixture of parallel and series connections. The value of the $R_u$ and $C_u$ may vary from process-run to process-run and wafer to wafer. A calibration process may be performed to provide precise values for the $R_u$ and $C_u$, by calibrating resistance and capacitance values of an on-chip calibration circuit, such as an RC calibration circuit 114. The calibration circuit 114 may be coupled, during the calibration process, via an on-chip switch S, to a pin (e.g., port) 111, which can be connected to the external capacitor with a capacitance $C_k$ (e.g., a supply bypass capacitor).

Figure 1B:
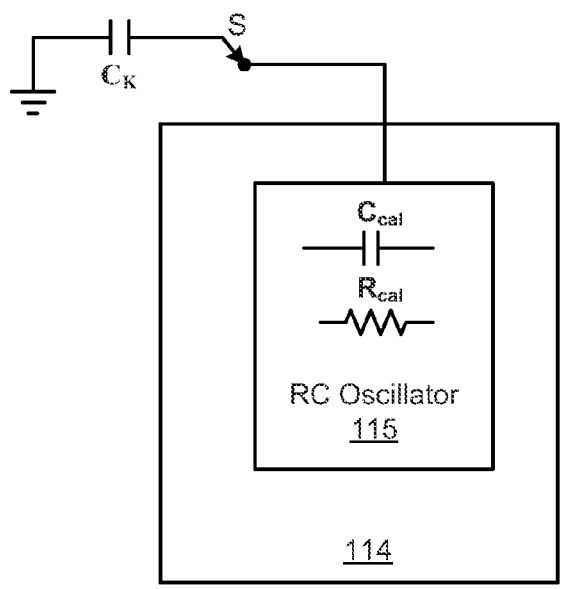
FIG. 1B illustrates an example RC-calibration circuit of FIG. 1A in accordance with one or more implementations.

FIG. 1B illustrates an example RC-calibration circuit 114 of FIG. 1A in accordance with one or more implementations of the subject technology. The RC-calibration circuit 114 may include an RC oscillator 115 with $R_{cal}$ and $C_{cal}$, respectively, as the resistance and capacitance values of its RC circuit. The switch S may connect the supply bypass capacitor $C_k$ to the RC oscillator 115. In one or more implementations, the supply bypass capacitor $C_k$ may add to the value $C_{cal}$ of the RC oscillator 115 (e.g., be connected in parallel to the capacitor of the RC oscillator). A first RCTC measurement of the RC oscillator 115 may be performed while the supply bypass capacitor $C_k$ is not coupled to the RC oscillator 115. The first RCTC measurement may provide a first value (e.g., $T_1$) for the RCTC of the RC oscillator 115, which can be expressed as:

$$T_1 = R_{cal} C_{cal} \quad (1)$$

In a second RCTC measurement, the switch S may be configured to couple the supply bypass capacitor $C_k$ to the RC oscillator 115. A second value (e.g., T2) for the RCTC of the RC oscillator 115 (e.g., with the supply bypass capacitor $C_k$ coupled) can be written as:

$$T_2 = R_{cal}(C_{cal} + C_K) \quad (2)$$

From the above equations (1) and (2), a value of capacitance $C_{cal}$ can be derived, which then can be plugged into equation (1) to find the value of the resistance $R_{cal}$. Therefore, based on the disclosed technique, the value of resistance $R_{cal}$ can be determined without the use of any external precision resistor and the expense of forming an external pin, and making a precision analog electrical connection to the external precision resistor. The first and the second RCTC measurements may be performed by a calibration system described herein.

Figure 1C:
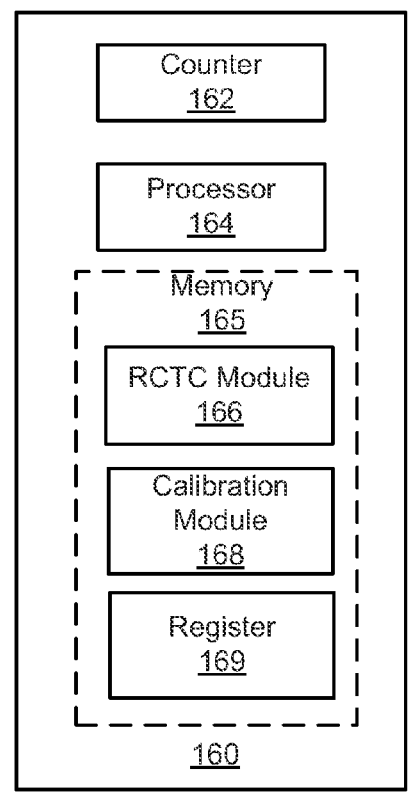
FIG. 1C illustrates an example calibration system for on-chip R and C calibration in accordance with one or more implementations.

FIG. 1C illustrates an example calibration system 160 for on-chip R and C calibration in accordance with one or more implementations of the subject technology. The calibration system 160 may reside on the chip 110 of FIG. 1A and may include a counter 162, one or more processors 164, and memory 165 (e.g., random-access memory (RAM), read-only memory (ROM), Flash memory, etc.). The memory 165 may include an RCTC module 166, a calibration module 168, and one or more registers 169. The RCTC module 166 and the calibration module 168 may be executable by one or more processors (e.g., 164). The RCTC module 166 and the calibration module 168 may perform calibration of the on-chip resistance (R) and capacitance (C) of the chip 110 upon startup of the device 100 of FIG. 1A.

In one or more implementations of the subject technology, RCTC module 166 may perform the first measurement, while the switch S of FIG. 1A or 1B is configured to uncouple the supply bypass capacitor $C_K$ from the calibration circuit 114. The switch S may be controlled by an on-chip controller implemented on the chip 110 of FIG. 1A or by the RCTC module 166. The RCTC module 166 may use the crystal oscillator 130 and the counter 162 to perform the first RCTC measurement. The first RCTC measurement may include measuring an oscillation period of the RC oscillator 115 of FIG. 1B. Following the first RCTC measurement, the RCTC module 166 may provide a value for the RCTC (e.g., $T_1$) of the RC oscillator 115 of FIG. 1B to the calibration module 168.

In a second RCTC measurement, the RCTC module may similarly measure a second RCTC (e.g., $T_2$), while the supply bypass capacitor $C_K$ is coupled to the calibration circuit 114. The second RCTC measurement may provide the value of $T_2$ corresponding to a combined RCTC of the above equation (2) to the calibration module 168. The calibration module 168 may use the above equations (1) and (2) to determine the value of the $C_{cal}$ based on the known value of $C_K$ and the measured values of $T_1$ and $T_2$ (e.g., from: $C_{cal} = C_K(T_1/(T_2-T_1))$, $R_{cal} = (T_2-T_1)/C_K$. The calibration module 168 may then use the determined values of $C_{cal}$ and the equation (1) above to determine the value of $R_{cal}$.

In one or more implementations of the second RCTC measurement, the switch S may couple the supply bypass capacitor $C_K$ to the on-chip calibration resistor $R_{cal}$, so that the second measurement can be made of a third RCTC, $T_3$ (e.g., a measured combined RCTC). The measured third RCTC value, $T_3$, can then be expressed as:

$$T_3 = R_{cal} C_K \quad (3)$$

Then using equations (1) and (3), values of $C_{cal}$ and $R_{cal}$ may be determined by the calibration module 168 from the following equations:

$$C_{cal} = C_K(T_1/T_3) \quad (4)$$

$$R_{cal} = T_3/C_K \quad (5)$$

In one or more aspects, the values of the calibration capacitance $C_{cal}$ and calibration resistance $R_{cal}$ may be to known factors (e.g., $K_1$ and $K_2$) of the on-chip unit-capacitance $C_u$ and unit-resistance $R_u$, respectively, which can in turn be determined from the values of the $R_{cal}$ and $C_{cal}$ and the known values of $K_1$ and $K_2$ (e.g., $C_u = C_{cal}/K_1$ and $R_u = R_{cal}/K_2$). The calibration module 168 may then determine the on-chip C and R values (e.g., calibrated values), based on the values of the on-chip unit-capacitance $C_u$ and unit-resistance $R_u$, respectively. For example, if a nominal value of $R_{cal}$ is 2KΩ and $K_1$ is 10, a nominal value for $R_u$=0.2KΩ, and an on-chip resistor with a nominal value of 5KΩ can be implemented as M $R_u$, where the multiplier factor M=25. However, if during the calibration process, the calibration module 168 determines $R_u$ to be 0.22KΩ, then the value of M for the on-chip resistor with the nominal value of 5 kΩ has to be changed to 23. In each calibration process, a new value of M may be determined, based on the determined value of $R_u$, and stored in register 169. The stored value of M may be applied to all resistors with the nominal value of 5 kΩ. For other on-chip resistors and capacitors with different nominal values, other multiplier factors (e.g., M, N, etc.) may be similarly determined, stored, and applied.

Figure 2A:
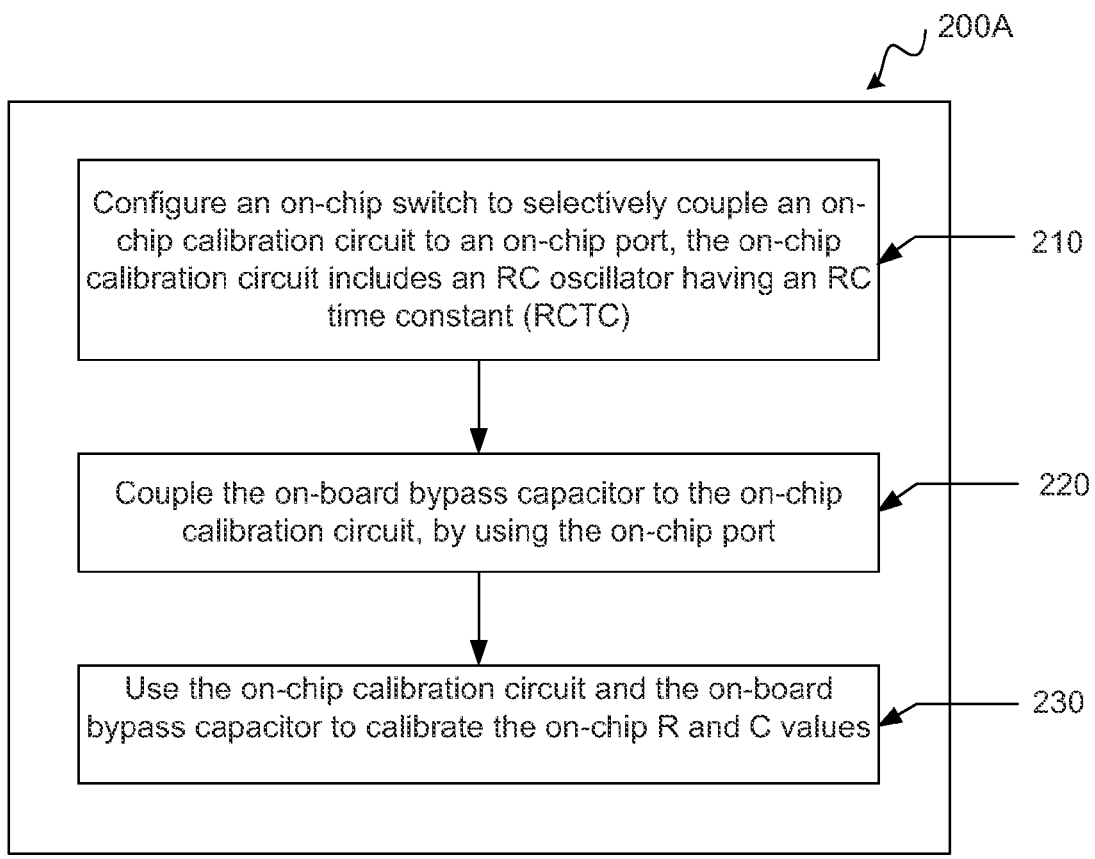
FIGS. 2A and 2B illustrate example methods for on-chip R and C calibration in accordance with one or more implementations.
Figure 2B:
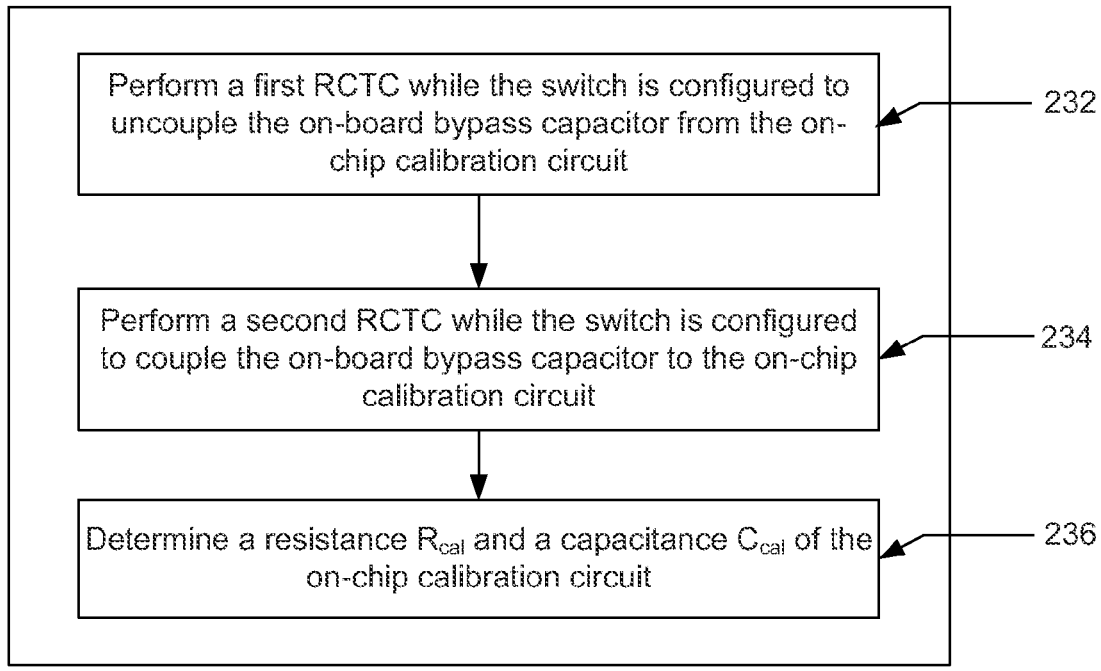

FIGS. 2A and 2B illustrate example methods 200A and 200B for on-chip R and C calibration in accordance with one or more implementations of the subject technology. For explanatory purposes, the example methods 200A and 200B are described herein with reference to the device 100 of FIG. 1A, calibration circuit 114 of FIG. 1B, and calibration system 160 of FIG. 1C; however, the example methods 200A and 200B are not limited to the device 100, calibration circuit 114, and calibration system 160. Further for explanatory purposes, the operation blocks of the example methods 200A and 200B are described herein as occurring serially or linearly. However, multiple blocks of the example methods 200A and 200B may occur in parallel. In addition, the blocks of the example methods 200A and 200B need not be performed in the order shown and/or one or more of the blocks of the example methods 200A and 200B need not be performed.

The methods 200A and 200B may use an on-chip calibration circuit (e.g., 114 of FIGS. 1A and 1B) including an RC oscillator (e.g., 115 of FIG. 1B) with an RC time constant (RCTC) to calibrate the on-chip resistance (R) and capacitance (C) values. At operation block 210, an on-chip switch (e.g., S of FIGS. 1A and 1B) may be configured to selectively couple the on-chip calibration circuit to an on-chip port (e.g., 111 of FIG. 1A). The on-chip calibration circuit may include the RC oscillator with the RC time constant RCTC. At operation block 220, the on-chip port may be used for coupling an on-board bypass capacitor (e.g., $C_k$ of FIGS. 1A and 1B) to the on-chip calibration circuit. The on-chip calibration circuit 214 may be used to calibrate the on-chip R and C values (operation block 230).

In one or more embodiments, the on-chip R and C values may be calibrated as described in connection with the example on-chip R and C calibration process illustrated in FIG. 2B, in accordance with one or more implementations of the subject technology. At operation sub-block 232, an RCTC module (e.g., 166 of FIG. 1C) may perform a first RCTC measurement, while the switch S is configured to uncouple the on-board bypass capacitor from the on-chip calibration circuit. At operation sub-block 234, the RCTC module may perform a second RCTC measurement, while the switch S is configured to couple the on-board bypass capacitor $C_K$ to the on-chip calibration circuit. Finally, at operation sub-block 236, a calibration module (e.g., 165 of FIG. 1C) may determine a resistance $R_{cal}$ and a capacitance $C_{cal}$ of the on-chip calibration circuit by using a result of the first and the second RCTC measurements. In one or more implementation, the on-chip RC calibration circuit may be realized on a chip including a wireless communication device. The realized RC calibration may be used to calibrate on-chip R and C values of the chip including the wireless communication device.

Figure 3:
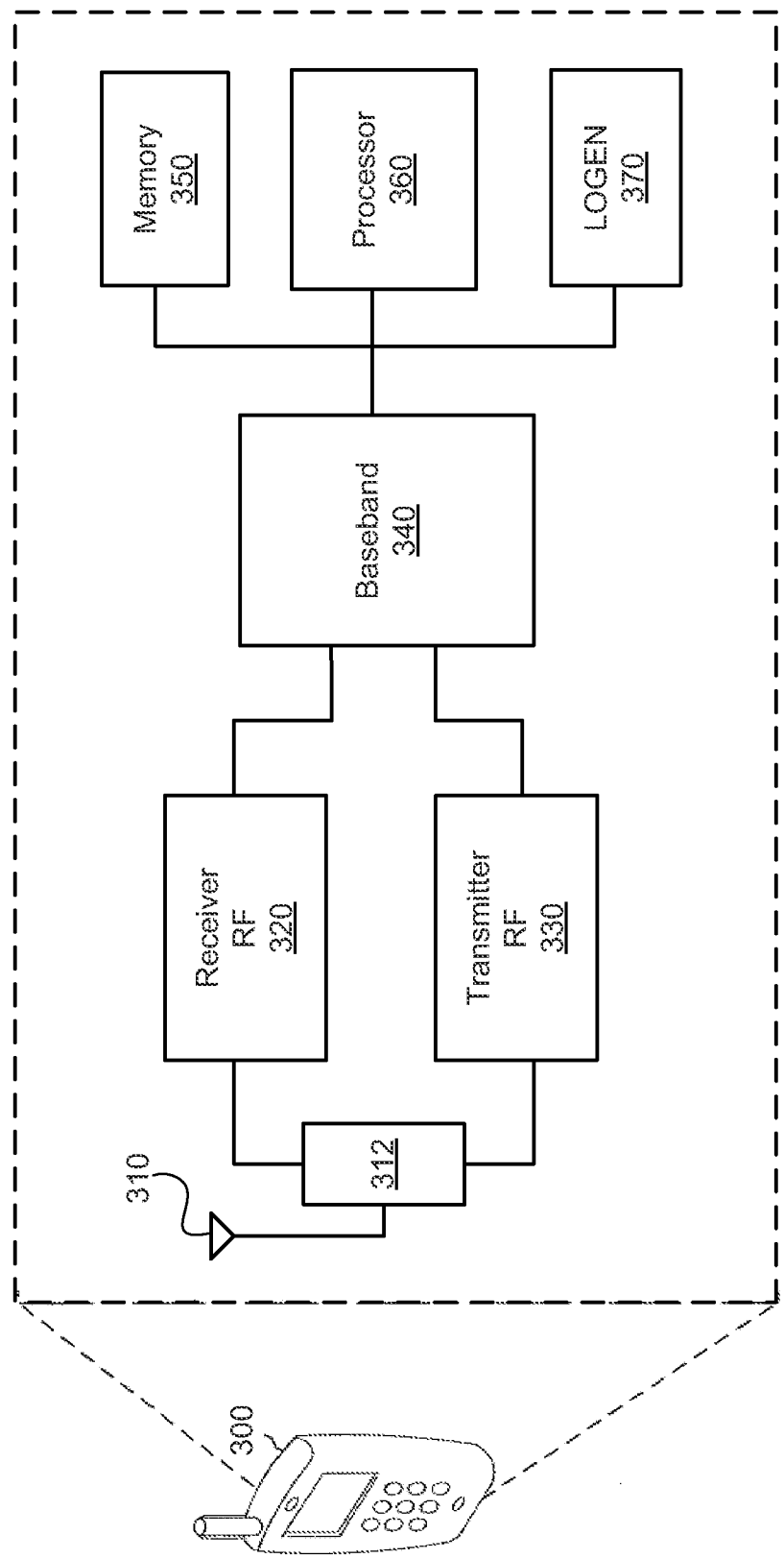
FIG. 3 illustrates an example wireless communication device in accordance with one or more implementations.

FIG. 3 illustrates an example wireless communication device 300 in accordance with one or more implementations of the subject technology. The wireless communication device 300 may comprise a radio-frequency (RF) antenna 310, a receiver 320, a transmitter 330, a baseband processing module 340, a memory 350, a processor 360, and a local oscillator generator (LOGEN) 370. In various embodiments of the subject technology, one or more of the blocks represented in FIG. 3 may be integrated on one or more semiconductor substrates. For example, the blocks 320-370 may be realized in a single chip or a single system on chip, or may be realized in a multi-chip chipset.

The RF antenna 310 may be suitable for transmitting and/or receiving RF signals (e.g., wireless signals) over a wide range of frequencies. Although a single RF antenna 310 is illustrated, the subject technology is not so limited.

The receiver 320 may comprise suitable logic circuitry and/or code that may be operable to receive and process signals from the RF antenna 310. The receiver 320 may, for example, be operable to amplify and/or down-convert received wireless signals. In various embodiments of the subject technology, the receiver 320 may be operable to cancel noise in received signals and may be linear over a wide range of frequencies. In this manner, the receiver 320 may be suitable for receiving signals in accordance with a variety of wireless standards. Wi-Fi, WiMAX, Bluetooth, and various cellular standards. In various embodiments of the subject technology, the receiver 320 may not require any SAW filters and few or no off-chip discrete components such as large capacitors and inductors.

The transmitter 330 may comprise suitable logic circuitry and/or code that may be operable to process and transmit signals from the RF antenna 310. The transmitter 330 may, for example, be operable to up-convert baseband signals to RF signals and amplify RF signals. In various embodiments of the subject technology, the transmitter 330 may be operable to up-convert and amplify baseband signals processed in accordance with a variety of wireless standards. Examples of such standards may include Wi-Fi, WiMAX, Bluetooth, and various cellular standards. In various embodiments of the subject technology, the transmitter 330 may be operable to provide signals for further amplification by one or more power amplifiers.

The duplexer 312 may provide isolation in the transmit band to avoid saturation of the receiver 320 or damaging parts of the receiver 320, and to relax one or more design requirements of the receiver 320. Furthermore, the duplexer 312 may attenuate the noise in the receive band. The duplexer may be operable in multiple frequency bands of various wireless standards.

The baseband processing module 340 may comprise suitable logic, circuitry, interfaces, and/or code that may be operable to perform processing of baseband signals. The baseband processing module 340 may, for example, analyze received signals and generate control and/or feedback signals for configuring various components of the wireless communication device 300 such as the receiver 320. The baseband processing module 340 may be operable to encode, decode, transcode, modulate, demodulate, encrypt, decrypt, scramble, descramble, and/or otherwise process data in accordance with one or more wireless standards.

The processor 360 may comprise suitable logic, circuitry, and/or code that may enable processing data and/or controlling operations of the wireless communication device 300. In this regard, the processor 360 may be enabled to provide control signals to various other portions of the wireless communication device 300. The processor 360 may also control transfers of data between various portions of the wireless communication device 300. Additionally, the processor 360 may enable implementation of an operating system or otherwise execute code to manage operations of the wireless communication device 300.

The memory 350 may comprise suitable logic, circuitry, and/or code that may enable storage of various types of information such as received data, generated data, code, and/or configuration information. The memory 350 may comprise, for example, RAM, ROM, flash, and/or magnetic storage. In various embodiment of the subject technology, Information stored in the memory 350 may be utilized for configuring the receiver 320 and/or the baseband processing module 340.

The local oscillator generator (LOGEN) 370 may comprise suitable logic, circuitry, interfaces, and/or code that may be operable to generate one or more oscillating signals of one or more frequencies. The LOGEN 370 may be operable to generate digital and/or analog signals. In this manner, the LOGEN 370 may be operable to generate one or more clock signals and/or sinusoidal signals. Characteristics of the oscillating signals such as the frequency and duty cycle may be determined based on one or more control signals from, for example, the processor 360 and/or the baseband processing module 340.

In operation, the processor 360 may configure the various components of the wireless communication device 300 based on a wireless standard according to which it is desired to receive signals. Wireless signals may be received via the RF antenna 310 and amplified and down-converted by the receiver 320. The baseband processing module 340 may perform noise estimation and/or noise cancellation, decoding, and/or demodulation of the baseband signals. In this manner, information in the received signal may be recovered and utilized appropriately. For example, the information may be audio and/or video to be presented to a user of the wireless communication device, data to be stored to the memory 350, and/or information affecting and/or enabling operation of the wireless communication device 300. The baseband processing module 340 may modulate, encode and perform other processing on audio, video, and/or control signals to be transmitted by the transmitter 330 in accordance to various wireless standards.

Those of skill in the art would appreciate that the various illustrative blocks, modules, elements, components, and methods described herein may be implemented as electronic hardware, computer software, or combinations of both. To illustrate this interchangeability of hardware and software, various illustrative blocks, modules, elements, components, and methods have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

A phrase such as "an aspect" does not imply that such aspect is essential to the subject technology or that such aspect applies to all configurations of the subject technology. A disclosure relating to an aspect may apply to all configurations, or one or more configurations. An aspect may provide one or more examples of the disclosure. A phrase such as an "aspect" may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples of the disclosure. A phrase such an "embodiment" may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples of the disclosure. A phrase such as a "configuration" may refer to one or more configurations and vice versa.

The word "exemplary" is used herein to mean "serving as an example, instance, or illustration." Any embodiment described herein as "exemplary" or as an "example" is not necessarily to be construed as preferred or advantageous over other embodiments. Furthermore, to the extent that the term "include," "have," or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. A device for calibration of on-chip resistance (R) and capacitance (C) values using an on-board bypass capacitor, the device comprising:
    an on-chip calibration circuit, including an RC oscillator having an RC time constant (RCTC), disposed on a chip to calibrate the on-chip R and C values;
    an on-chip switch configurable to selectively couple the on-chip calibration circuit to an on-chip port, the on-chip port being used for coupling the on-board bypass capacitor to the on-chip calibration circuit; and
    a calibration module configured to calibrate the on-chip R and C values using the on-chip calibration circuit and the on-board bypass capacitor, wherein the on-board bypass capacitor is external to the chip.

2. The device of claim 1, wherein an RCTC module is configured to perform:
    a first RCTC measurement, while the switch is configured to uncouple the on-board bypass capacitor from the on-chip calibration circuit; and
    a second RCTC measurement, while the switch is configured to couple the on-board bypass capacitor to the on-chip calibration circuit, wherein the RCTC module is further configured to perform the first and the second RCTC measurements by measuring a period associated with an oscillation frequency of the RC oscillator using a reference oscillator.

3. The device of claim 2, wherein the measured period is a measure of the RCTC of the on-chip calibration circuit.

4. The device of claim 2, further comprising an on-board crystal oscillator, and wherein the RCTC module is configured to use the on-board crystal oscillator as the reference oscillator, and wherein the on-board crystal oscillator comprises a crystal oscillator used by one or more on-chip circuits including at least one synthesizer, wherein the on-board crystal oscillator is external to the chip.

5. The device of claim 2, wherein the RCTC module is configured to perform the second RCTC measurement by measuring a combined RCTC that includes a known capacitance value of the on-board bypass capacitor.

6. The device of claim 5, wherein the calibration module is configured to determine the resistance R and the capacitance C of the on-chip calibration circuit by using the measured RCTC of the on-chip calibration circuit, the measured combined RCTC, and the known capacitance value of the on-board bypass capacitor.

7. The device of claim 6, wherein the calibration module is further configured to determine the on-chip unit resistance ($R_u$) and unit-capacitance ($C_u$) values based on the determined resistance $R_{cal}$ and capacitance $C_{cal}$ of the on-chip calibration circuit, and wherein the calibration module is further configured to calibrate the on-chip R and C values based on the determined $R_u$ and $C_u$ values.

8. A method for calibration of on-chip resistance (R) and capacitance (C) values using an on-board bypass capacitor, the method comprising:
    configuring an on-chip switch to selectively couple an on-chip calibration circuit to an on-chip port of a chip, the on-chip calibration circuit including an RC oscillator having an RC time constant (RCTC);
    coupling the on-board bypass capacitor to the on-chip calibration circuit, by using the on-chip port; and
    using the on-chip calibration circuit and the on-board bypass capacitor to calibrate the on-chip R and C values, herein the on-board bypass capacitor is external to the chip.

9. The method of claim 8, wherein using the on-chip calibration circuit and the on-board bypass capacitor to calibrate the on-chip R and C values comprises using an RCTC module to perform:
    a first RCTC while the switch uncouples the on-board bypass capacitor from the on-chip calibration circuit; and
    a second RCTC measurement while the switch couples the on-board bypass capacitor to the on-chip calibration circuit, wherein the reference oscillator is used by the RCTC module to measure a period associated with an oscillation frequency of the RC oscillator.

10. The method of claim 9, wherein the measured period is a measure of the RCTC of the on-chip calibration circuit.

11. The method of claim 9, wherein performing the first RCTC measurement includes using, as the reference oscillator, an already available on-board crystal oscillator, wherein the on-board crystal oscillator is external to the chip.

12. The method of claim 11, wherein the already available on-board crystal oscillator comprises a crystal oscillator used by one or more on-chip circuits including at least one synthesizer.

13. The method of claim 9, wherein performing the second RCTC measurement comprises measuring, using the RCTC module, a combined RCTC that includes a known capacitance value of the on-board bypass capacitor.

14. The method of claim 13, wherein determining the resistance $R_{cal}$ and the capacitance $C_{cal}$ of the on-chip calibration circuit comprises using, by a calibration module, the measured RCTC of the on-chip calibration circuit, the measured combined RCTC, and the known capacitance value of the on-board bypass capacitor.

15. The method of claim 14, further comprising determining, by the calibration module, the on-chip unit-resistance ($R_u$) and unit-capacitance ($C_u$) values based on the determined resistance R and capacitance C of the on-chip calibration circuit.

16. The method of claim 15, further comprising calibrating, by the calibration module, the on-chip R and C values based on the determined on-chip unit-resistance ($R_u$) and unit-capacitance ($C_u$) values.

17. A system for calibration of on-chip resistance (R) and capacitance (C) values using an on-board bypass capacitor, the system comprising:
    an on-chip calibration circuit, including an RC oscillator having an RC time constant (RCTC), disposed on a chip to calibrate the on-chip R and C values;
    an on-chip switch configurable to selectively couple the on-chip calibration circuit to an on-chip port, the on-chip port being used for coupling the on-board bypass capacitor to the on-chip calibration circuit;
    an RCTC module configured to perform a first RCTC measurement while the switch is configured to uncouple the on-board bypass capacitor from the on-chip calibration circuit, and to perform a second RCTC measurement while the switch is configured to couple the on-board bypass capacitor to the on-chip calibration circuit; and
    a calibration module to determine a resistance $R_{cal}$ and a capacitance $C_{cal}$ of the on-chip calibration circuit by using a result of the first and the second RCTC measurements, and to calibrate the on-chip R and C values based on the determined resistance $R_{cal}$ and capacitance $C_{cal}$ of the on-chip calibration circuit, wherein the on-board bypass capacitor is external to the chip.

18. The system of claim 17, wherein:
    the RCTC module is configured to perform the first RCTC measurement by measuring a period associated with an oscillation frequency of the RC oscillator using a reference oscillator,
    the measured period is a measure of the RCTC of the on-chip calibration circuit, and
    the RCTC module is configured to perform the second RCTC measurement by measuring a combined RCTC that includes a known capacitance value of the on-board bypass capacitor.

19. The system of claim 18, further comprising an already available on-board crystal oscillator disposed to be used as the reference oscillator, and wherein the already available on-board crystal oscillator comprises a crystal oscillator used by one or more on-chip circuits including at least one synthesizer, herein the on-hoard crystal oscillator is external to the chip.

20. The system of claim 18, wherein the calibration module is configured to determine the resistance R and the capacitance C of the on-chip calibration circuit by using the measured RCTC of the on-chip calibration circuit, the measured combined RCTC, and the known capacitance value of the on-board bypass capacitor, wherein the calibration module is further configured to determine the on-chip unit resistance ($R_u$) and unit-capacitance ($C_u$) values based on the determined resistance $R_{cal}$ and capacitance $C_{cal}$ of the on-chip calibration circuit, and wherein the calibration module is further configured to calibrate the on-chip R and C values based on the determined $R_u$ and $C_u$ values.

\* \* \* \* \*